(12) United States Patent
Minelly et al.

(10) Patent No.: US 9,083,140 B2
(45) Date of Patent: Jul. 14, 2015

(54) HIGH-POWER CW FIBER-LASER

(75) Inventors: John D. Minelly, San Jose, CA (US); Sergei V. Govorkov, Los Altos, CA (US); Luis A. Spinelli, Sunnyvale, CA (US); Douglas Anthon, El Cerrito, CA (US); Jay Michael Ingalls, Folsom, CA (US)

(73) Assignee: Coherent, Inc., Santa Clara, CA (US)

( * ) Notice: Subject to any disclaimer, the term of this patent is extended or adjusted under 35 U.S.C. 154(b) by 323 days.

(21) Appl. No.: 13/074,593

(22) Filed: Mar. 29, 2011

(65) Prior Publication Data

US 2012/0230352 A1 Sep. 13, 2012

Related U.S. Application Data

(60) Provisional application No. 61/451,335, filed on Mar. 10, 2011.

(51) Int. Cl.
| | | |
|---|---|---|
| *H01S 3/30* | (2006.01) | |
| *H01S 3/042* | (2006.01) | |
| *H01S 3/067* | (2006.01) | |
| *H01S 3/0941* | (2006.01) | |
| *H01S 3/04* | (2006.01) | |

(Continued)

(52) U.S. Cl.
CPC ............ *H01S 3/042* (2013.01); *H01S 3/06704* (2013.01); *H01S 3/08059* (2013.01); *H01S 3/09415* (2013.01); *H01S 3/0407* (2013.01); *H01S 3/06733* (2013.01); *H01S 3/0804* (2013.01); *H01S 3/094015* (2013.01); *H01S 3/105* (2013.01); *H01S 3/1062* (2013.01); *H01S 3/1618* (2013.01); *H01S 3/173* (2013.01); *H01S 5/4012* (2013.01); *H01S 2301/03* (2013.01)

(58) Field of Classification Search
CPC . H01S 3/08059; H01S 3/09415; H01S 3/105; H01S 3/173; H01S 3/0804; H01S 3/094015; H01S 2301/03
USPC ........ 372/6, 99; 385/35, 31; 359/341.1, 341.3
See application file for complete search history.

(56) References Cited

U.S. PATENT DOCUMENTS

| | | | |
|---|---|---|---|
| 4,762,385 A | * | 8/1988 | Fuse ............................... 385/33 |
| 4,818,062 A | | 4/1989 | Scifres et al. |

(Continued)

FOREIGN PATENT DOCUMENTS

| | | | |
|---|---|---|---|
| DE | 4017354 A1 | * 12/1991 | ............. C03C 25/02 |
| JP | 2008021899 A | * 1/2008 | ............. H01S 3/042 |

OTHER PUBLICATIONS

Jeong et al., "Multi-kilowatt Single-mode Ytterbium-doped Large-core Fiber Laser," Dec. 4, 2009, Journal of the Optical Society of Korea, vol. 13, No. 4, pp. 416-422.*

(Continued)

*Primary Examiner* — Julio J Maldonado
*Assistant Examiner* — Joshua King
(74) *Attorney, Agent, or Firm* — Morrison & Foerster LLP

(57) ABSTRACT

A CW fiber-laser includes a gain fiber having a reflector proximity-coupled to one end, with the other end left uncoated. A laser resonator is defined by the reflector and the uncoated end of the gain-fiber. Pump-radiation from two fast-axis diode-laser bar stacks is combined and focused into the uncoated end of the gain-fiber for energizing the fiber. Laser radiation resulting from the energizing is delivered from the uncoated end of the gain-fiber and separated from the pump-radiation by a dichroic mirror.

24 Claims, 13 Drawing Sheets

(51) Int. Cl.
H01S 3/08 (2006.01)
H01S 3/094 (2006.01)
H01S 3/105 (2006.01)
H01S 3/106 (2006.01)
H01S 3/16 (2006.01)
H01S 3/17 (2006.01)
H01S 5/40 (2006.01)

(56) References Cited

U.S. PATENT DOCUMENTS

| | | |
|---|---|---|
| 5,268,978 A | 12/1993 | Po et al. |
| 5,379,315 A | 1/1995 | Meinzer |
| 5,533,163 A | 7/1996 | Muendel |
| 5,689,522 A | 11/1997 | Beach |
| 5,943,463 A | 8/1999 | Unuma et al. |
| 5,946,437 A * | 8/1999 | Uchida et al. ............ 385/77 |
| 6,167,177 A * | 12/2000 | Sandstrom et al. ........ 385/100 |
| 6,400,513 B1 | 6/2002 | Southwell |
| 6,948,862 B2 * | 9/2005 | Brown ............ 385/92 |
| 7,369,582 B2 | 5/2008 | Kumkar et al. |
| 7,540,668 B2 * | 6/2009 | Brown ............ 385/78 |
| 7,903,696 B2 | 3/2011 | Klebanov |
| 2004/0081396 A1 | 4/2004 | Komine et al. |
| 2006/0280208 A1 * | 12/2006 | Baev et al. ............ 372/6 |
| 2007/0172174 A1 * | 7/2007 | Scerbak et al. ............ 385/76 |
| 2009/0190218 A1 * | 7/2009 | Govorkov et al. ............ 359/495 |
| 2010/0247055 A1 | 9/2010 | Arashitani et al. |
| 2010/0260210 A1 | 10/2010 | Spinelli et al. |

OTHER PUBLICATIONS

Minelly, et al., All-glass kW Fibre Laser End-pumped by MCCP-Cooled Diode Stacks, 2011 Con Ference on Lasers And Electro-Opti Cs Eu Rope and 12th European Quantumelectroni Cs Conference (Cleo Europe/Eqec), May 1, 2011, 1 page.

Wang et al., "Analysis of Raman and Thermal Effects in Kilowatt Fiber Lasers", Optics Communications, vol. 242, 2004, pp. 487-502.

Invitation to Pay Additional Fees received for PCT Patent Application No. PCT/US2012/027445, mailed on Jun. 6, 2012, 6 pages.

International Search Report and Written Opinion received for PCT Patent Application No. PCT/US2012/027445, mailed on Oct. 1, 2012, 28 pages.

Non-Final Office Action received for U.S. Appl. No. 13/633,411, mailed on May 22, 2014, 17 pages.

International Preliminary Report on Patentability received for PCT Patent Application No. PCT/US2012/027445, mailed on Sep. 19, 2013, 17 pages.

Notice of Allowance received for U.S. Appl. No. 13/633,411, mailed on Dec. 22, 2014, 14 pages.

* cited by examiner

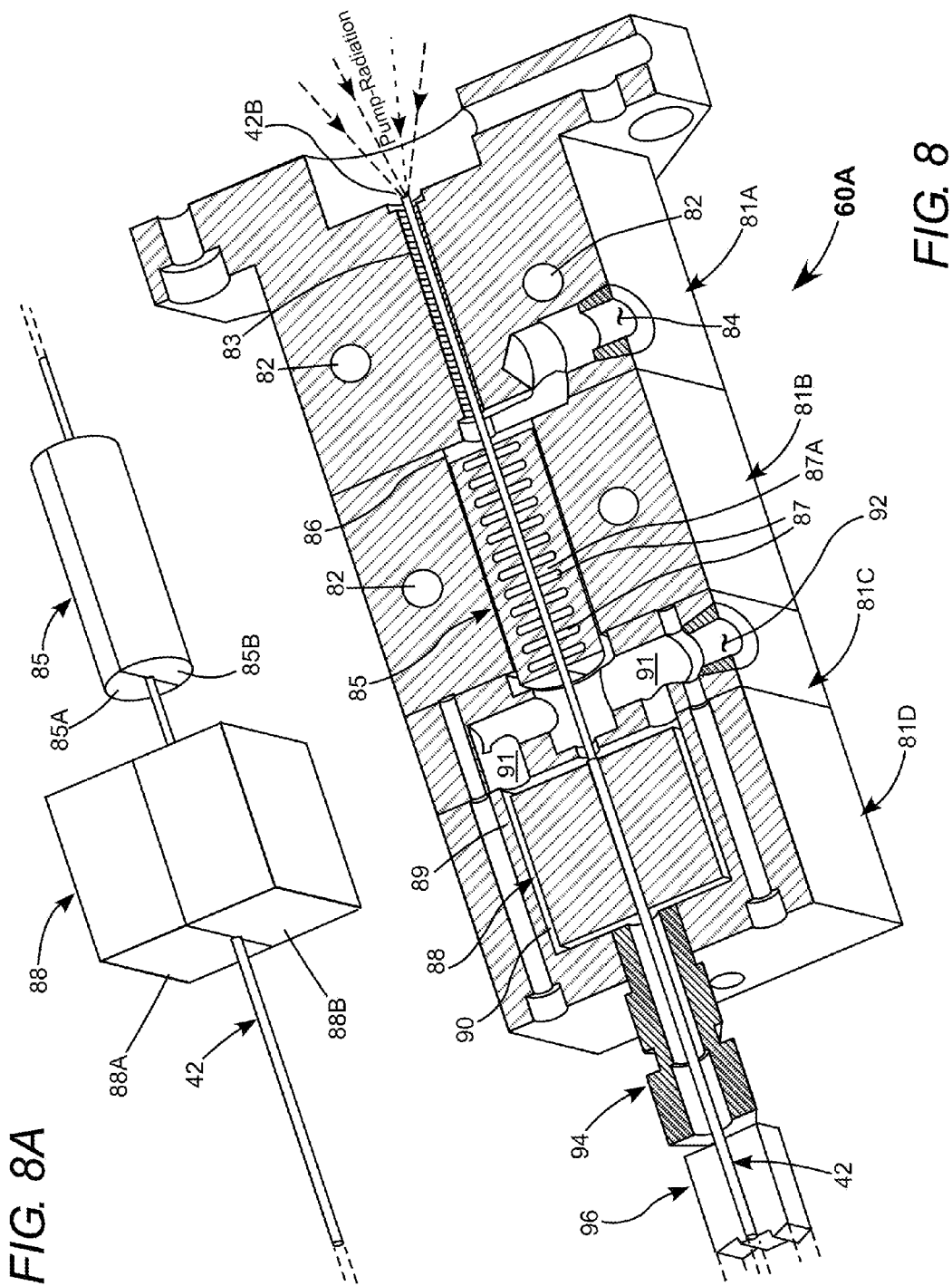

HIGH-POWER CW FIBER-LASER

PRIORITY

This application claims priority to U.S. Provisional Application Ser. No. 61/451,335, filed Mar. 10, 2011, the disclosure of which is incorporated herein by reference.

TECHNICAL FIELD OF THE INVENTION

The present invention relates in general to fiber-lasers. The invention relates in particular to high-power, continuous wave (CW) fiber-lasers

DISCUSSION OF BACKGROUND ART

Fiber-lasers are gradually replacing conventional solid-state lasers in several laser applications. Fiber-lasers have advantages over solid-state lasers in ruggedness and optical efficiency. CW fiber-lasers are capable of delivering a very high-powered beam, for example, a beam having a power in excess of 1 kilowatt (kW). Pulsed fiber-lasers can deliver peak-power as high as 10 kW or greater. Fiber-lasers can have a high optical efficiency, for example between about 60% and 90%.

High-power CW fiber-lasers with multimode output are extremely useful in material processing applications, such as cutting of complex 3D shapes found in hydro-formed automotive parts and long-offset welding of complex-shaped parts. High peak-power pulsed fiber-lasers with single mode output can be used for scribing of solar-cell panels. Advantageously, high peak-power enables efficient frequency-conversion into visible and UV wavelength ranges.

In theory at least, the output power of a fiber-laser is limited only by how much optical pumping power can be delivered into an optical gain-fiber for energizing a doped-core of the gain-fiber. In practice, there are limits due, inter alia, to non-linear effects which can broaden the spectrum of pump radiation resulting in reduction of absorption efficiency, and photo-darkening of the fiber material which can lead to reduction of efficiency, excessive heating, and even catastrophic failure. The non-linear effects become increasingly problematical as the gain-fiber is longer. Long gain-fibers are necessary with low brightness diode-laser pump sources currently available.

FIG. 1 schematically illustrates a prior-art fiber-laser arrangement 10. Laser 10 includes a gain-fiber 12 having a doped core (not shown). Pump radiation from a plurality of diode-laser modules 18 is coupled into the cladding of the gain fiber via N-to-1 couplers 20 spliced to the gain fiber. Only two diode-laser modules per coupler are depicted in FIG. 1 for simplicity of illustration. In practice there be as many as 6 diode lasers inputting to a 6-to-1 coupler. Pump radiation is coupled into both ends of the gain-fiber.

A resonant cavity extending through the gain-fiber is formed by fiber Bragg gratings (FBGs) 14 and 16 written in passive fibers 15 spliced to the central fiber of the coupler. FBG 14 is maximally reflecting at a lasing wavelength of the gain-fiber and FBG 16 is partially transmissive at that wavelength to allow laser output. The output may be delivered for use in an application or passed on to one or more stages of amplification. This arrangement would require fiber splices (depicted by a bold "X" in FIG. 1) between the diode-laser modules and the couplers, between the couplers and the gain fiber, and between the couplers and the FBG fibers.

Fiber-splices and FBGs can be a source of instability due to transverse mode-coupling. Other issues include grating walk-off and modal instability. The latter issue arises because the fibre laser community, for the most part, is focussed on single-transverse-mode operation of the fiber-lasers in spite of the fibres themselves being multimode to avoid nonlinear impairments. Any fiber-splice is potentially a source of loss, due to less-than-perfect core-alignment, and potentially a source of mechanical failure. Clearly, the more splices the greater will be the potential for problems resulting from the aforementioned issues.

A method of pumping a gain-fiber which does not require fiber splices is to directly focus radiation from an array of diode-laser emitters into the gain-fiber. A one-dimensional array of diode-laser emitters is typically referred to as a diode-laser bar. The emitters have an emitting aperture about 1 micrometer (μm) high (in what is referred to as the fast-axis of the emitter) and a width from about 10 μm to over 100 μm (in what is referred to as the slow-axis of the emitter). The bars are usually about 1 centimeter (cm) long and between about 1 and 4 millimeters (mm) wide, with the emitters having a length in the width-direction of the bar and emitting apertures aligned in the slow-axis direction. Typical diode-laser bars include about 20 emitters with a fill factor of about 20%. If more radiation is required than can be provided by a one-dimensional array, a two-dimensional array of emitters can be formed by stacking a plurality of diode-laser arrays, one above the other in the fast-axis direction, but the separation between bars in the stacking direction is usually greater than about 1.5 millimeters (mm) to allow for each bar to be mounted on a thermally conductive sub-mount for cooling. This provides an aggregate beam which has a radially asymmetric cross-section, being much longer in the fast-axis direction than in the slow-axis direction.

Two-dimensional arrays of this kind can have as many as twenty diode-laser bars vertically stacked providing a total output of a few kilowatts. Such arrays are typically used for heat-treatment of metals and the like where accurate focusing is not required and radial asymmetry is not a problem. This radial asymmetry, however, makes focusing into a gain-fiber difficult and inefficient at best.

In U.S. Pre-Grant Publication No. 2010/0260210 gain-fiber pumping method is described wherein a plurality of diode-laser bars is used to optically pump a corresponding plurality of external-cavity vertically-emitting optically-pumped semiconductor (OPS) lasers with radiation from the OPS-lasers being used to directly pump a gain-fiber. FIG. 2 schematically illustrates a simplified arrangement 22 for carrying out this method. Here, gain-fiber 12 includes FBGs 14 and 16 forming a resonator as described above. Gain-fiber 12 has a doped core 17 surrounded by an inner cladding 19 which is surrounded by an outer cladding 21.

Optical pump radiation is provided by a pump module 23 including plurality of OPS-lasers 24. Each laser delivers a beam of radiation 25 preferably in a single lateral mode or at least a "low-$M^2$" (for example $M^2<2$) mode. The beams are collimated, and are directed parallel to each other, here, by an arrangement of turning mirrors 27, to a positive lens 28. Radiation from all of the beams is focused by lens 28, as indicated by converging rays 29, into inner cladding 19 of gain-fiber 16, with a small portion, of course, directed into core 17. It is taught that in practice, as many as two-hundred fifty beams having $M^2<2$ may be directed onto lens 28 and focused into a gain-fiber having an inner cladding diameter of about 100 μm and a numerical aperture (NA) of about 0.22. Assuming a relatively modest output power of about 30 W for a single-chip OPS laser, it is possible to couple as much as 7.5 kW of radiation into such a gain-fiber.

This pumping method uses the OPS-lasers essentially as "brightness converters" to convert poor-quality low-brightness diode-laser beams into high quality, high brightness laser beams. It remains to be seen, however, whether the advantage of efficient focusing of the OPS-laser beams is sufficient to offset the less-than-100% efficiency of conversion, the cost of the OPS-lasers, and the cost of a beam-combining arrangement for as many as two-hundred fifty OPS laser-beams. There remains a need to develop an effective method of direct pumping using two-dimensional diode-laser arrays.

SUMMARY OF THE INVENTION

In one aspect, laser apparatus in accordance with the present invention comprises a gain-fiber having first and second opposite ends, the gain-fiber providing optical gain over a characteristic gain-bandwidth. A laser resonator is formed between the first end of the gain-fiber and a mirror proximity-coupled to the second end of the gain-fiber. A source of optical pump-radiation is provided the pump-radiation having a pump-radiation wavelength. The mirror is highly reflective for wavelengths within the gain-bandwidth of the fiber, highly reflective for the pump-radiation wavelength, and highly transmissive for radiation having wavelengths longer than the gain-bandwidth. An optical arrangement is provided and configured to focus at least a substantial portion of the pump-radiation into the first end of the gain-fiber, thereby causing laser-radiation at a natural wavelength within the gain-bandwidth to be generated in the laser-resonator, and delivered from the first end of the gain-fiber as output radiation. The gain-fiber is configured and arranged such that the generated and delivered radiation is multiple-lateral-mode radiation, and the transmission wavelengths of the mirror are selected such that collateral generation of stimulated Raman scattering is minimized.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 8 is a three-dimensional longitudinal cross-section view schematically illustrating details of the coupler in the fiber-laser of FIG. 5 including a conduction-cooled ferrule surrounding and end of the gain-fiber from which the polymer layers have been stripped and an air-cooled block surrounding a portion of the fiber with polymer layers present.

FIG. 8A is a three dimensional view schematically illustrating further details of the ferrule and cooling block of the coupler of FIG. 8.

DETAILED DESCRIPTION OF THE INVENTION

Figure 1:
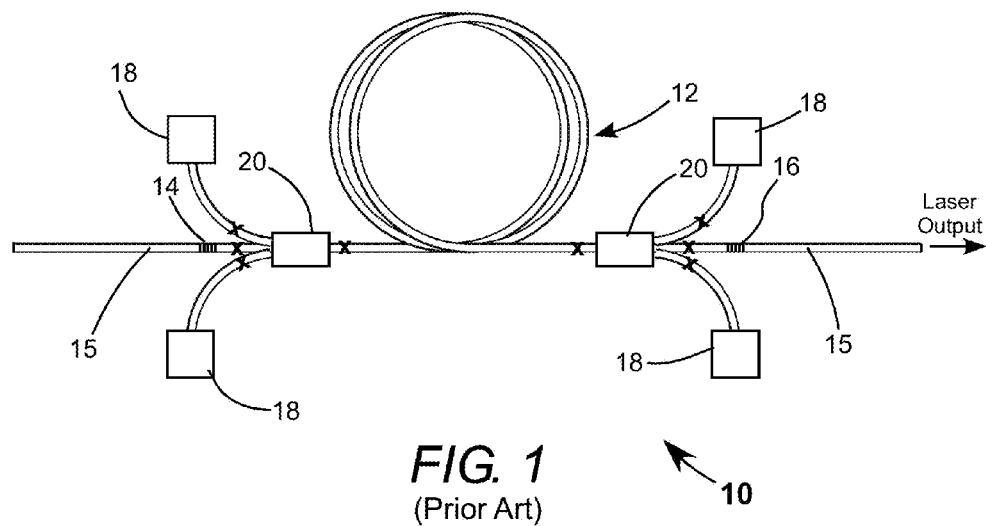
FIG. 1 schematically illustrates one prior-art fiber-laser arrangement with pump-radiation from a plurality of diode-lasers coupled into the cladding a gain-fiber using a plurality of N-to-1 fused fiber couplers.
Figure 2:
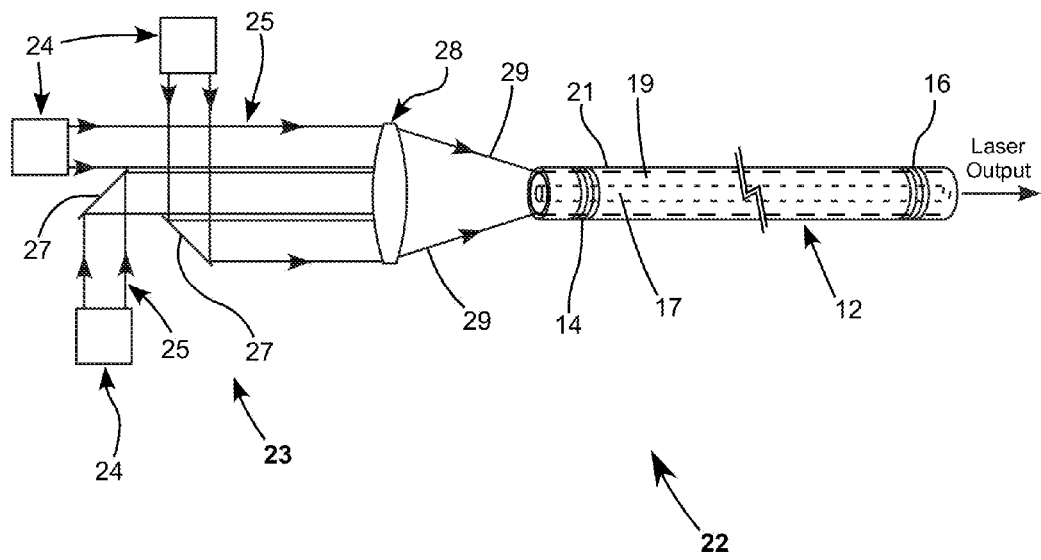
FIG. 2 schematically illustrates another prior-art fiber-laser arrangement with pump-radiation from a plurality of OPS-lasers focused into a gain-fiber by a single lens.
Figure 3:
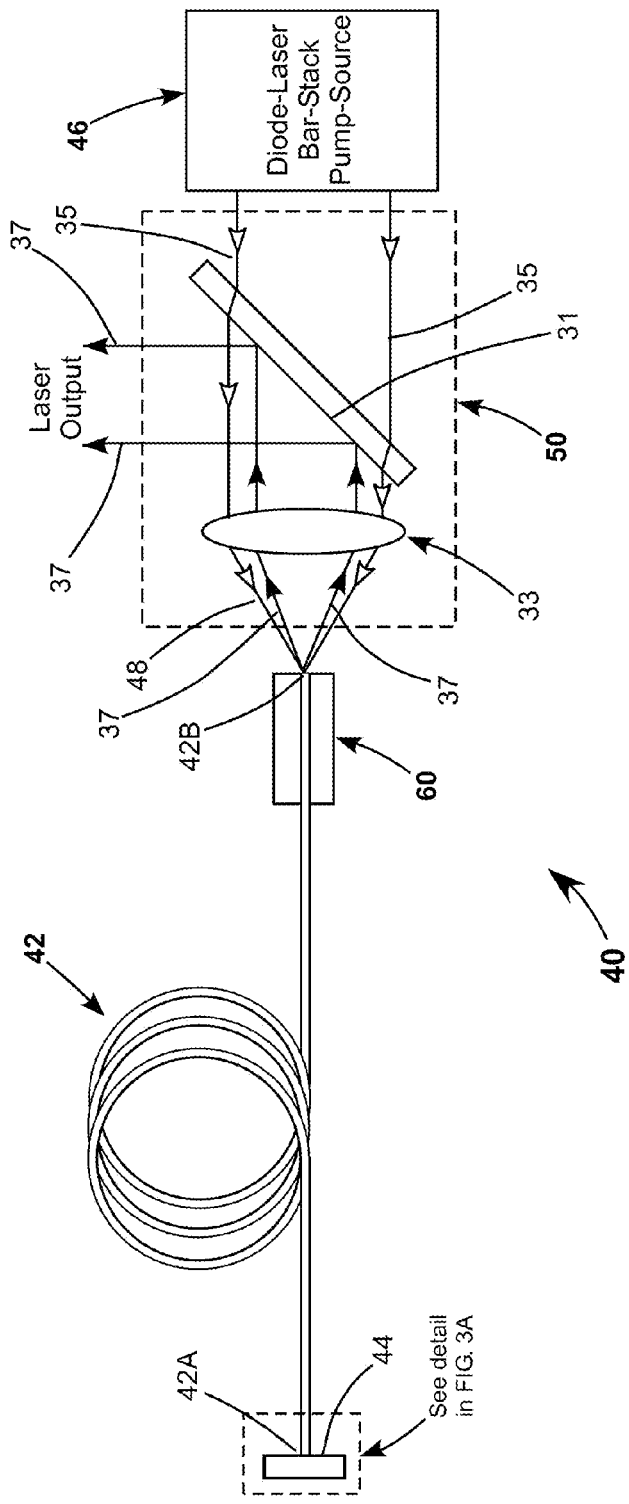
FIG. 3 schematically illustrates a basic embodiment of a fiber-laser in accordance with the present invention including a gain-fiber having a maximally reflective mirror proximity-coupled to one end thereof and being uncoated at the other end, a diode-laser bar-stack pump-source providing pump-radiation for the gain-fiber, an optical arrangement for focusing the pump-radiation into the uncoated end of the fiber and separating laser output radiation from the uncoated end of the fiber from the counter-propagating pump-radiation.

Continuing with reference to the drawings, wherein like components are designated by like reference numerals, FIG. 3 schematically illustrates a basic embodiment 40 of a fiber-laser in accordance with the present invention. Laser 40 includes a multi-mode gain-fiber 42 having a mirror 44 which is maximally reflective in the gain-bandwidth of the gain-fiber and proximity-coupled to one end 42A of the gain-fiber. The opposite end 42B of the gain-fiber is preferably left uncoated, which provides for only about 4% reflectivity, not significantly wavelength selective. This low reflectivity provides a very high (96%) output-coupling percentage for a resonator formed between mirror 44 and the uncoated end of the gain-fiber. In the inventive fiber-laser, output-coupling greater than 90% is preferred.

Pump-radiation for gain-fiber 42 is supplied by a diode-laser bar-stack source 46 including a plurality of diode-laser bars (not shown in FIG. 3). A combined collimated beam from the diode-laser bars is designated by bounding rays 35 thereof. Beam 48 is transmitted through a dichroic mirror 31 in an optics module 50 and is focused by optics 33 (depicted as a single lens element for simplicity of illustration) into end 42B of the gain-fiber. Dichroic mirror 31 is highly transmissive for the pump-radiation wavelength and maximally reflective for the wavelengths in the gain-bandwidth of the gain-fiber. Mirror 44 is also highly reflective for the pump-radiation wavelength to provide for double-pass absorption of pump-radiation in the gain-fiber This particular architecture provides for multi-mode (multiple lateral mode) operation of the laser. The multi-mode laser-radiation 37 delivered from gain-fiber 42 is collimated by optics 33 and reflected by dichroic mirror 31 out of optics module 50 as laser output.

A coupler 60 is provided around end 42B of the gain-fiber. This coupler is provided to absorb and remove pump-radiation that cannot propagate in a first cladding (not shown) of the gain-fiber to prevent damage to the gain-fiber. A detailed description of a preferred arrangement of coupler 60 is provided further hereinbelow.

Figure 3A:
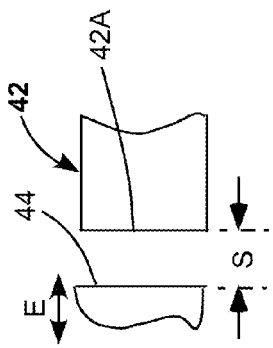
FIG. 3A is a fragmentary view schematically illustrating details of the proximity coupling of the maximally reflective mirror of FIG. 3 with the mirror being axially translatable with respect to the end of the gain-fiber.

FIG. 3A is a fragmentary view schematically illustrating details of the proximity coupling of mirror 44 to the gain fiber. The term proximity-coupling indicates that the mirror can be spaced by a relatively small distance S from end 42 the gain fiber with the gain-fiber with distance S being sufficiently small that a diverging beam of laser radiation leaving the core of the gain-fiber will be directed back into the gain-fiber, without the assistance of any intermediate optical element, without an unacceptable loss. This is facilitated by a relatively large diameter of the multi-mode fiber core. In one example laser in accordance with the present invention, a spacing distance up to 100 micrometers (µm) has been found acceptable.

This proximity coupling provides that the mirror can be mounted in a fixture for precise alignment. In a discussion of experimental results provided further hereinbelow advantages of making distance S selectively variable, for example by selectively axially translating the mirror as indicated by arrows E, are discussed. The mirror can be considered as forming an asymmetrical etalon having a cavity thickness S with the end of the gain-fiber. Alternatively the air space can be considered as a variable thickness air-layer on the mirror so there is a variable wavelength selective modulation of the reflectivity across an otherwise broad reflection band.

Figure 4:
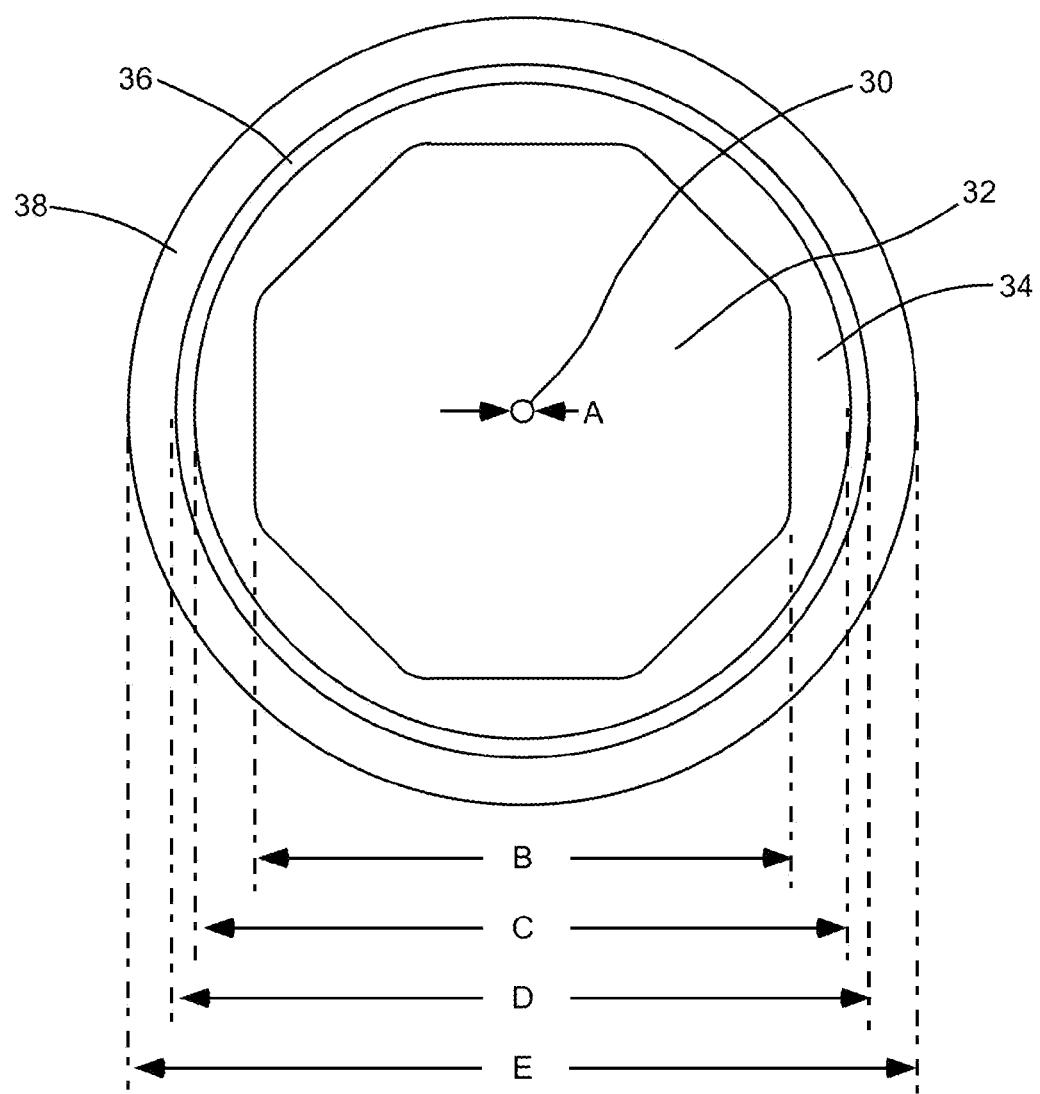
FIG. 4 is an un-shaded cross-section view schematically illustrating a preferred configuration a gain-fiber for use in a fiber-laser in accordance with the present invention, including a core, a first cladding surrounding the core, a second cladding surrounding the first cladding, a primary polymer layer surrounding the second cladding and a secondary polymer layer surrounding the primary polymer layer.

FIG. 4 is an un-shaded cross-section view schematically illustrating a preferred configuration gain-fiber 42. The gain-fiber includes an alumino-silicate core 30 doped with between about 0.4 to 1.0 weight % ytterbium (Yb). This core has a refractive index of about 1.452. Laser-radiation at a wavelength of about 1100 nm is generated when the core is pumped by pump-radiation having a wavelength of between about 915 and 980 nm.

Surrounding core 30 is a first cladding 32 of fused silica having an octagonal cross-section. This cladding has a refractive index at the laser wavelength of about 1.45 which provides for a core NA of about 0.06. Surrounding cladding 32 is a second cladding 34 of fluorine-doped glass. The first cladding has a lower refractive index than the core for retaining laser radiation in the core. The second cladding 34 has a lower refractive index than the first cladding 32 for retaining pump-radiation in the first cladding. In this preferred example, cladding 34 has a refractive index at the pump wavelength of 1.433, which provides for a pump radiation NA of about 0.22.

A primary polymer layer 36 surrounds second cladding layer 34. The primary polymer layer is a layer of fluoro-acrylate having a refractive index 1.37, i.e., less than that of second cladding 34. A secondary polymer layer 38 surrounds primary polymer layer 36. This secondary polymer layer is a layer of acrylate having a refractive index of 1.52, i.e., greater than that of the primary polymer layer.

Regarding dimensions of the gain-fiber core and layers, core 30 is a multimode core having a diameter (A) of about 30.0 micrometers (µm). Octagonal cladding 32 measures 606 µm (B) across the flat portions. Layers 34, 36 and 38 have outside diameters C, D, and E of 728 µm, 775 µm, and 877 µm, respectively.

Figure 5:
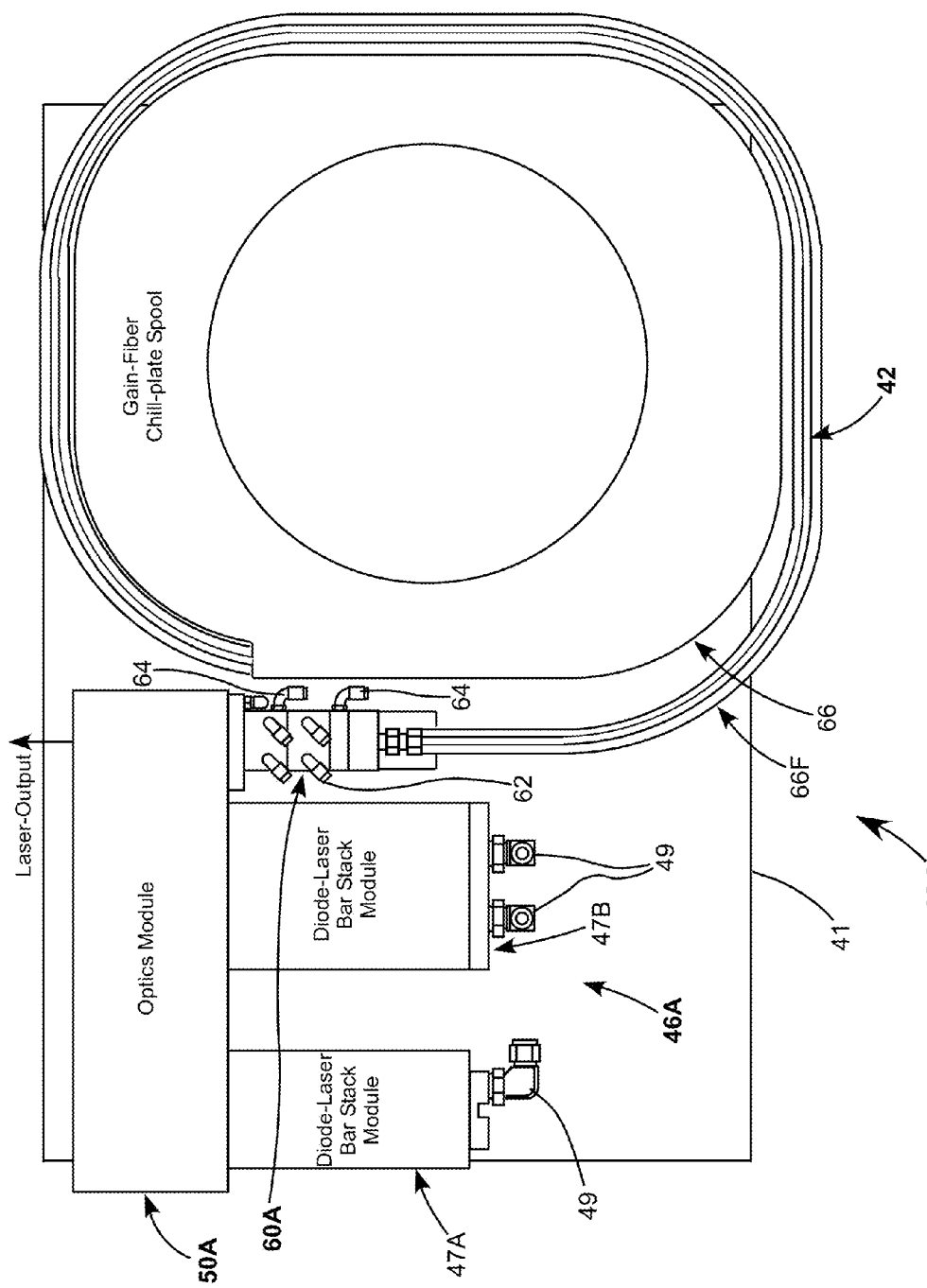
FIG. 5 schematically illustrates a preferred embodiment of a fiber-laser in accordance with the present invention including a gain-fiber, a pump-radiation source including two diode-laser bar-stack modules, an optics module for combining beams from the diode-laser bar-stack modules and focusing the combined beams into an uncoated end of the gain-fiber, and a coupler arrangement surrounding the gain-fiber around the uncoated end thereof for removing pump-radiation which cannot propagate in the gain-fiber.

FIG. 5 schematically illustrates a preferred embodiment 40A of a fiber-laser in accordance with the present invention including a gain-fiber. Components of the laser are assembled here on a base 41. A pump-radiation source 46A includes two diode-laser bar-stack modules 47A and 47B. These bar-stack modules are essentially identical but with one rotated at 90 with respect to the other for reasons discussed further hereinbelow. The diode-laser bar-stack in each bar-stack module is fluid cooled via inlets and outlets 49.

The bar-stack modules deliver pump-radiation into an optics module 50A which performs functions similar to those performed by optics module 50 of laser 40 of FIG. 3. Coupler 60A has a four-part body with parts nearest end 42B of the gain-fiber being fluid-cooled via inlets and outlets 62. Certain internal components of the coupler are air-cooled via inlet couplers 64. Further details of the coupler are presented further hereinbelow.

Gain-fiber 42 is preferably cooled along the entire length of the fiber. Most of the gain-fiber is retained in a spiral groove (not visible) in a fluid-cooled spool 66. The terminal mirror of the gain-fiber, corresponding to mirror 44 of FIG. 3 is obscured by the spool. In this embodiment of the inventive fiber-laser, gain-fiber 42 has a length of about sixty-five meters (65 m). Between the output of coupler 60A and the spool the gain-fiber is retained in a groove in a fluid-cooled flexure 66A separate from spool 66. Other methods of cooling the fiber between the coupler and the spool are possible at relatively low power. One method is to simply cool the fiber with flowing air from a fan.

The bend radius of the gain-fiber is preferably greater than about 8 inches for the fiber cross-section dimensions exemplified above, this relatively large bend radius being selected for minimizing differential modal gain. Minimizing this differential modal gain is important in achieving stable laser operation. This large bend radius in turn enables efficient use of the 0.22 NA all-glass fluorosilicate cladding that essentially eliminates any issues of degradation of the polymer layer by the high power light propagation.

The gain-fiber as described above with reference to FIG. 4 can deliver about 1.0 kW of multi-mode radiation from the uncoated end thereof when pumped with pump-radiation having a power about equal to or greater than about 1.4 kW. It should be noted that components depicted in FIG. 5 are relatively to scale with the exception of the diameter of the gain-fiber which is exaggerated for convenience of description.

Figure 6:
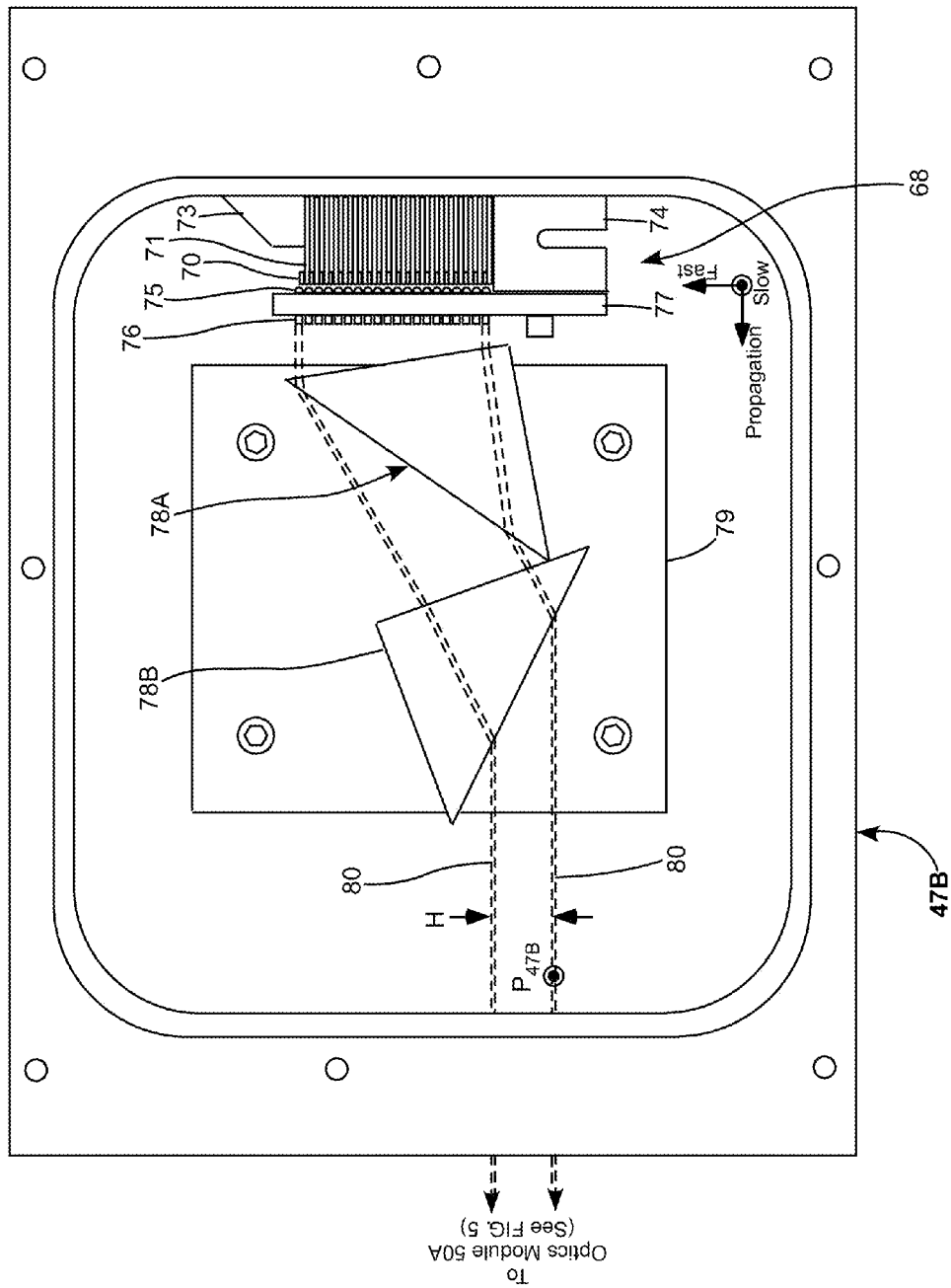
FIG. 6 schematically illustrates details of a diode-laser bar-stack module of the fiber-laser of FIG. 5.

FIG. 6 schematically illustrates bar-stack module 47B with a cover removed to show internal components of the module. A diode-laser bar stack 68 includes twenty diode-laser bars 70 stacked in the fast-axis direction of the diode-laser bars. Such a stack may be referred to as a fast-axis diode-laser bar stack. Each diode-laser bar is mounted on a thermally conductive sub-mount 71. The sub-mounts are clamped between fluid-cooled (water-cooled) members 73 and 74. Such a fast-axis diode-laser bar stack is commercially available from Coherent Inc. of Santa Clara, Calif. as an Onyx MCCP 9010-HDPKG diode-laser bar-stack. In such a stack, the fast-axis stacking pitch of the bars is 1.6 mm. A twenty-bar stack delivers about 1.0 kW of radiation. In this example, the pump-radiation from the bar stack has a wavelength of about 976 nm. Associated with each diode-laser bar are a fast-axis collimating lens 75 and a slow-axis collimating-lens array 76, with the array having one lens for each emitter in the diode-laser bar. Here, the lenses are supported on a frame 77 bolted to member 74.

Dashed lines 80 indicate the path of collimated beams from uppermost and lowermost ones of the diode-laser bars 20. Beams from all of the diode-laser bars will have a total fast-axis height of about 32.0 mm leaving the slow-axis lens arrays. The width of the combined beams will be about 10.0 mm which is the slow-axis length of an individual diode-laser bar. A pair of prisms, 78A and 78B, mounted on a base 79, form an anamorphic beam-compressor. This beam compressor reduces the total fast-axis height (H) of the beams to about 11.0 mm, so the fast and slow axis dimensions of the beams are about equal. Radiation in the beams is plane-polarized with the polarization-plane aligned with the slow-axis, i.e., perpendicular to the plane of the drawing as indicated by arrowhead $P_{47B}$. The fast-axis-compressed beams are delivered to optics module 50A. A cylindrical telescope could be substituted for prisms 78A and 78B for reducing the fast-axis beam dimension without departing from the spirit and scope of the present invention.

Figure 7:
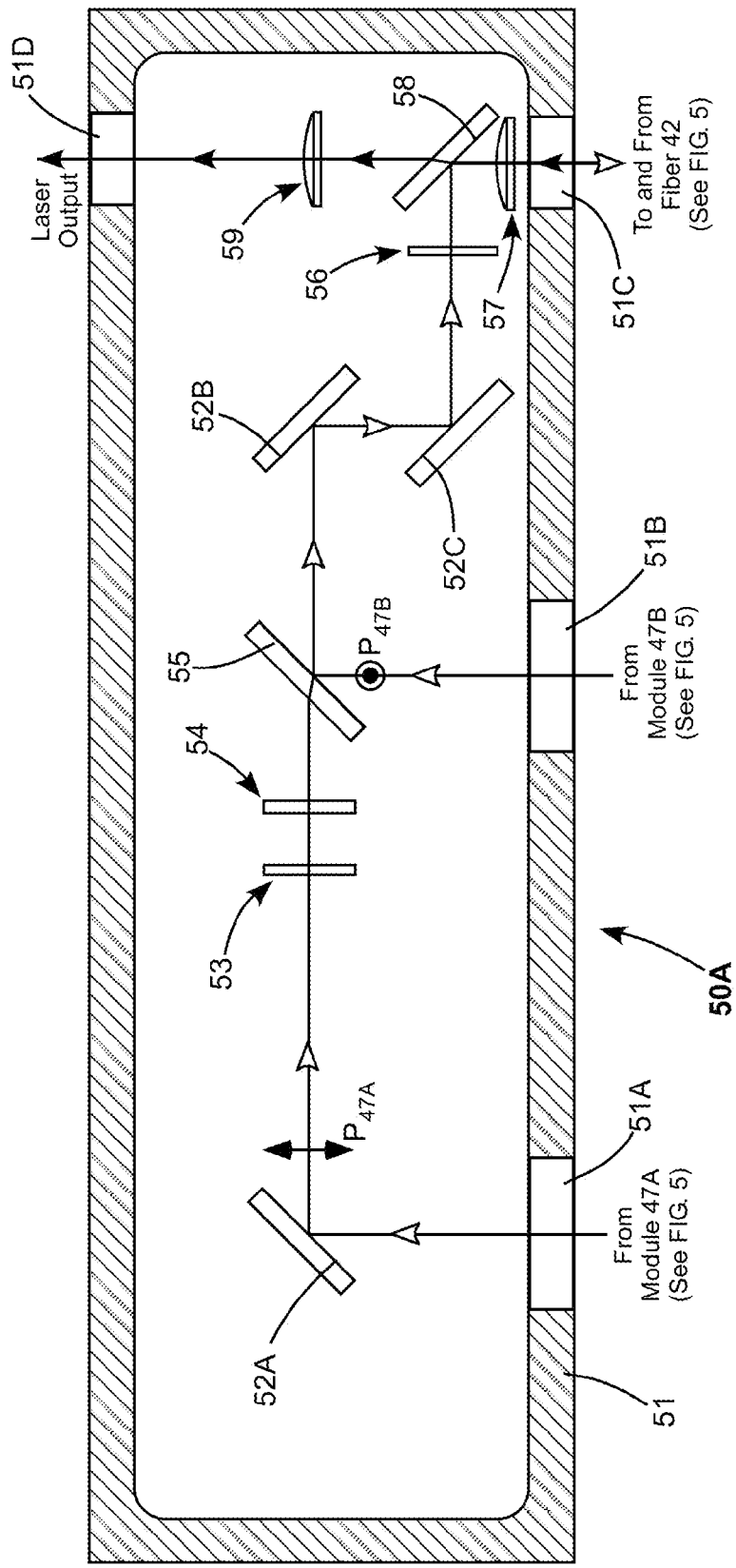
FIG. 7 schematically illustrates details of optical arrangements in the optics module of the fiber-laser of FIG. 5

FIG. 7 schematically illustrates a preferred arrangement of optics in optics module 50A of laser 40A of FIG. 5. In this illustration, only one axial ray of each beam, entering, leaving, or propagating in the module is depicted for simplicity of illustration. Pump-radiation is designated by open arrowheads and laser-radiation is designated by solid arrowheads.

Optical elements are contained in an enclosure 51. Pump-radiation from diode-laser bar-stack modules 47A and 47B enters the enclosure via apertures 51A and 51B, respectively, in the enclosure. Since diode-laser bar-stack module 47A is rotated at 90° with respect to module 47B, the polarization-plane of radiation from module 47A is oriented at 90° to the polarization-plane of radiation from module 47B, as indicated in FIG. 7 by arrows $P_{47A}$ and arrowhead $P_{47B}$.

Radiation from module 47A is directed by a turning mirror 52A through lens elements 53 and 54 to a polarization-sensitive beam-combiner 55. Beam-combiner 55 is highly transmissive for radiation p-polarized with respect to the beam-combiner and highly reflective for radiation s-polarized with respect to the beam-combiner. Beams from the two diode-laser bar-stack modules are combined along a path to turning mirror 52B. Power in the combined beams is about 1.6 kW in this example. The purpose of lens elements is to compensate for size-differences between beams from the two diode-laser bar stack modules due to less-than-perfect collimation and different path lengths to dichroic beam-combiner 55.

If the fast-axis to slow-axis ratio of each beam is not exactly unity, the 90°-rotation of the beams with respect to each other provides that the combined beam leaving beam-combiner 55 has a symmetrical cross-section. The combined beam cross-section, however, will not be circular, and the intensity distribution across the beam will be a complex, non-Gaussian distribution. This beam conditioning of anamorphic compression in the fast axis and crossed-axes to achieve beam symmetry facilitates focusing into the gain-fiber. However, it can be stated that the pump-radiation beam has poor quality as far as spatial intensity-distribution is concerned.

Leaving beam combiner 55, the combined pump-radiation beams are directed by turning mirrors 52B, 52C, and a dichroic beamsplitter 58 towards gain-fiber 42. The combined beams are focused by lens elements 56 and 57 through aperture 51C into the gain-fiber. Laser radiation emitted from the gain-fiber as a result of optical pumping is collimated by lens element 57. Dichroic beamsplitter 58 is highly reflective for the wavelength of pump radiation and highly transmissive for the laser-radiation wavelength. Collimated laser radiation is transmitted through dichroic beamsplitter 58 and exits enclosure 51 via aperture 51D therein as laser output-radiation. Optionally, a lens element 59 can be provided for focusing the output-radiation into a transport fiber (not shown).

It should be noted here that while the outputs of only fast-axis diode-laser bar stacks are polarization combined in the above-discussed example to provide a pump-radiation power greater than one kilowatt, the output of more such stacks can be combined to provide even greater pump-radiation power. By way of example the output of one diode-laser bar stack having an output wavelength of 915 nm may be spectrally combined using a dichroic beam-combiner with the output of another diode-laser bar stack having an output wavelength of 976 nm, with the polarization plane of the stacks being the same orientation. Both wavelengths are suitable of pumping a Yb-doped gain-fiber. Another two diode-laser bar stacks can be similarly spectrally combined and the output of one spectrally combined pair can be polarization combined to provide a combined output of four diode-laser bar stacks. Those skilled in the art will recognize from this description that other bar-stack combinations are possible without departing from the spirit and scope of the present invention.

In prior-art fiber-lasers there is typically a length of passive fiber spliced to the end of the gain-fiber (active fiber) and pump-radiation is focused into the passive fiber and transferred to the first cladding of the active fiber. One reason for doing this is that the active fiber dissipates a certain percentage, for example between about 20% and 50% of the pump radiation as heat as optical conversion is not 100%-efficient. Accordingly, the active fiber needs to be cooled everywhere along its length as discussed above.

In a fiber-laser in accordance with the present invention, pump-radiation is focused directly into the gain-fiber (active fiber). A primary reason for doing this is to avoid the potential inefficiency and unreliability of a passive-fiber to active-fiber splice.

The pump radiation beam focused directly into gain-fiber 42, while having a more or less symmetrical cross-section, is of relatively poor spatial uniformity as described above. A result of this is that the focused beam has a significant amount of its energy content outside of the convergence angle that can be focused into the first cladding. Accordingly, several hundred Watts of power misses end 42B of the fiber and needs to be dissipated without overheating and damaging the fiber and components supporting it.

Additionally, fibers have a limited acceptance angle defined by their NA (numerical aperture). Here again, due to the poor spatial quality of the pump-radiation, a significant portion of power initially focused into the fiber lies outside this acceptance angle. A result of this is that this portion eventually escapes the fiber and could cause heating and damage to anything surrounding the fiber. Yet another portion of the pump radiation continues to propagate in the second cladding. Gain-fibers typically have a protective coating made of one or more layers of organic (polymer) material. A portion of the light propagating in the second cladding eventually couples into the polymer coating and would cause damage if of sufficient intensity and in the absence of a cooling means. A significant challenge in directly pumping gain-fiber 42 in accordance with the present invention is providing a coupler that could effect the dissipation or attenuation of the above-discussed "stray" radiation while still being able to cool the gain-fiber and surrounding components.

Figure 8B:
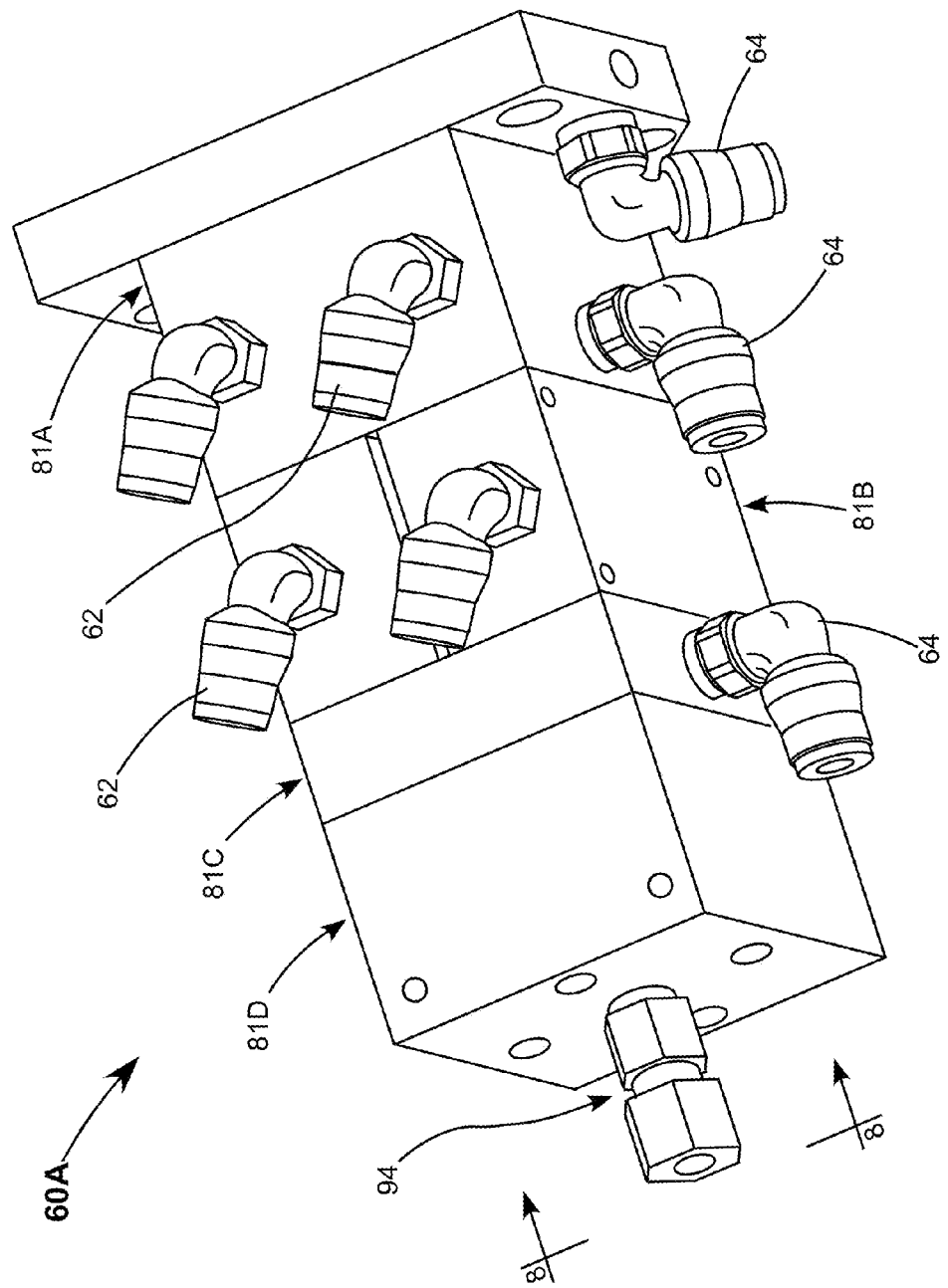
FIG. 8B is a three-dimensional view schematically illustrating the entire coupler and designating the longitudinal-section plane of FIG. 8A by arrows 8A-8A.

FIG. 8 is a longitudinal cross-section view schematically illustrating a preferred arrangement 60A of coupler 60 of the laser of FIG. 3. FIG. 8A schematically illustrates complete internal elements of the coupler. FIG. 8B is a three-dimensional view schematically depicting the entire coupler. Coupler 60A has a body formed from four sections 81A, 81B, 81C, and 81D, preferably made from copper (Cu). Sections 81A and 81B are fluid-cooled (water-cooled) by flowing a coolant through channels 82 therein. In sections 81A, B, and C, gain-fiber 42 has primary and secondary polymer coatings 36 and 38 (see FIG. 4) stripped off. In section 81A, the stripped gain-fiber is free standing in a cylindrical channel 83 having a diameter between about 3-times and 10-times bigger than the OD of the stripped gain-fiber to allow air circulation. The wall of the channel is textured to increase the surface area of the wall. This can be done conveniently by means of a screw-thread as schematically illustrated.

In section 81A, pump-radiation that misses end 42B of the gain-fiber, and pump-radiation escaping the fiber after a very short propagation length is absorbed in the textured wall of channel 83, and any heat generated as a result of the absorption is conducted away from the channel. Heat generated in the fiber through less-than-100% conversion of pump radiation to laser radiation is carried away by flowing air through channel 83 from an inlet aperture 84.

In section 81B, mode-stripping of most of radiation propagating in second cladding 34 takes place. Here the "mode-stripper" is a cylindrical copper element 85 made from two parts 85A and 85B, between which the stripped gain-fiber is held. The element is a tight fit in a channel 86 in section 81B to permit good thermal conduction between the element and the water-cooled section. The assembled element is sectioned by a plurality of circular cut-outs 87 leaving "fins" 87A therebetween. The cut-outs provide a large surface area for absorbing stripped cladding modes, and the sectioning of the copper element provides relief from thermal expansion mismatch between the copper and the fiber. Because of a difficulty with forming narrow semicircular grooves of the correct radius in the fins 87A in which the fiber is to be held, it has been found useful to actually bond the fiber to the fins with a thermally conductive adhesive. Thermally conductive epoxy and metallic indium have been found to be useful as such adhesives.

In section 81D, the fiber includes the primary and secondary polymer layers, into which any radiation not stripped from the second cladding in section 81B can leak. For this reason, this part of the gain-fiber is cooled by conduction into a cooling-block 88 formed from two parts 88A and 88B. The fiber fits tightly between parts 88A and 88B but the complete block is smaller than a cut-out 89 made to receive the cooling-block leaving a space 90 between the cooling-block and cut-out 89.

Section 81C of the coupler is a transition section between sections 81B and 81D and includes a gallery 91 into which air can be forced via an aperture 92. Air is forced into gallery 91 and cools the free-standing part of the stripped fiber between mode-stripper element 85 and cooling block 88. The air flows from gallery 91 through space 90 between block 88 and cut-out 89 and cools the free-standing portion of the gain-fiber in an exit-sleeve 94 of the coupler. Immediately on exiting sleeve 94, fiber 42 is supported on a grooved chill-plate 96 for the entire length of the fiber.

In initial tests of an example of the inventive fiber-laser it was found to exhibit unstable output of an undesirable pulsed form when average output power was increased above about 50% of the design maximum, in this case above 500 W in a example having a design peak reliable operating power of 1 kW. This pulsing is schematically depicted graphically in FIG. 9. Here, output is in the form of very short, pulses occurring at more or less regular intervals with noisy CW operation at nominal average power in between pulses. The pulses typically have a peak-power between about two and twenty times the nominal average power. The pulse repetition interval is equal to the laser cavity round-trip time or a harmonic thereof. It is believed without being limited to a particular theory that this pulsing behavior of the output is due to resonant enhancement of stimulated Raman scattering (SRS).

Stimulated Raman Scattering is known to be a limiting factor in power-scaling of rare-earth doped fiber-lasers because it causes a parametric broadening of the laser spectrum out of the useful wavelength (gain-bandwidth) range and causing temporal instabilities due to the fast response to energizing compared that of a rare-earth transition. In the 1000-nm spectral region, the Raman gain peaks at a Stokes-shifted wavelength approximately 60 nm (3 THz) longer than the signal (lasing) wavelength. However, some Raman gain is present at all wavelengths between the signal wavelength and peak Raman-gain wavelength.

In fiber amplifiers, the power loss to Raman-gain grows from noise, and requires the Raman gain to reach a very high value of around 60 dB before significant power transfer can occur. The situation is similar in fiber-laser resonators employing Bragg gratings of very limited bandwidth as reflectors.

In the inventive laser, a broad band dielectric mirror is used for the highly reflective (HR) mirror, and an uncoated end-face of the gain-fiber is used for the pump input and laser output coupling mirror. In the laser that provided the output of FIG. 9, the HR mirror had a bandwidth broad enough to form a resonant cavity at the Raman gain wavelengths in addition to a resonant cavity at the lasing wavelength. It was postulated that this "Raman-resonator" led to supplementation of the rare-earth (Yb in this example) gain by Raman gain (at low levels) which is a major contributor to spectral broadening. Measurements indicated that when the spectral-width of the output approached the 60 nm Stokes-shift wavelength, the pulsing effect of FIG. 9 occurred. It is believed that the pulsing behavior is initiated by small amplitude fluctuations due to longitudinal mode beating with a resonantly-enhanced Raman gain in the pulsed regime allowing for more efficient energy extraction from the Yb gain-medium.

Figure 9:
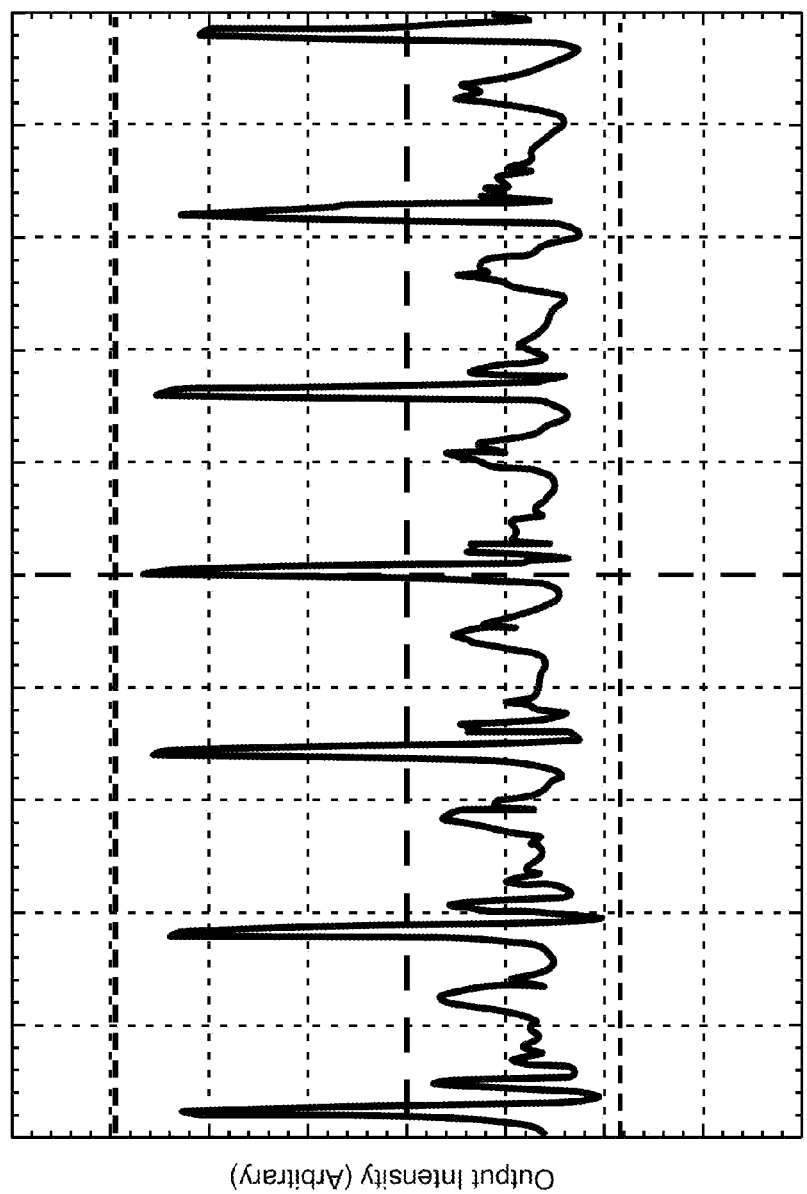
FIG. 9 is a reproduction of an oscilloscope trace schematically depicting output power as a function of time in an example of the laser of FIG. 3 with resonance-enhanced Raman gain causing unwanted pulsed behavior of the output.

The pulsing problem was substantially mitigated by replacing the original highly reflective mirror in the example of FIG. 9 with new mirror having a transmission-edge at a shorter wavelength. Transmission as a function of wavelength transmission spectra) for the original and new mirrors is schematically graphically depicted in FIG. 10. The spectrum of the original mirror is depicted by a dashed curve and the spectrum of the new mirror is depicted by a solid curve. Those skilled in the art will recognize that as these are multilayer dielectric mirrors the reflection will be essentially 100% minus the indicated transmission. It can be seen that the original mirror is highly reflective in the Raman gain band which lies between wavelengths of about 1140 nm and about 1180 nm. The new mirror is still highly reflective over most of the Yb gain-band between about 1080 nm and 1120 nm but is highly transmissive for Raman gain band 1140-1180 nm. Both mirrors are highly reflective at the pump-radiation wavelength of about 980 nm.

The new mirror design was refined by experimentally determining the natural wavelength of operation of the experimental inventive fiber-laser in the threshold regime using the original mirror. This is the longest wavelength for which the gain exceeds the loss of the cavity and is determined, inter alia, by the length of the laser cavity and the doping concentration in the fiber core. The new mirror is essentially a long-wavelength pass (long-pass) filter having cutoff wavelength (at reflection or transmission equal to 50%) within 10 nm of the experimentally determined natural lasing wavelength.

Figure 11:
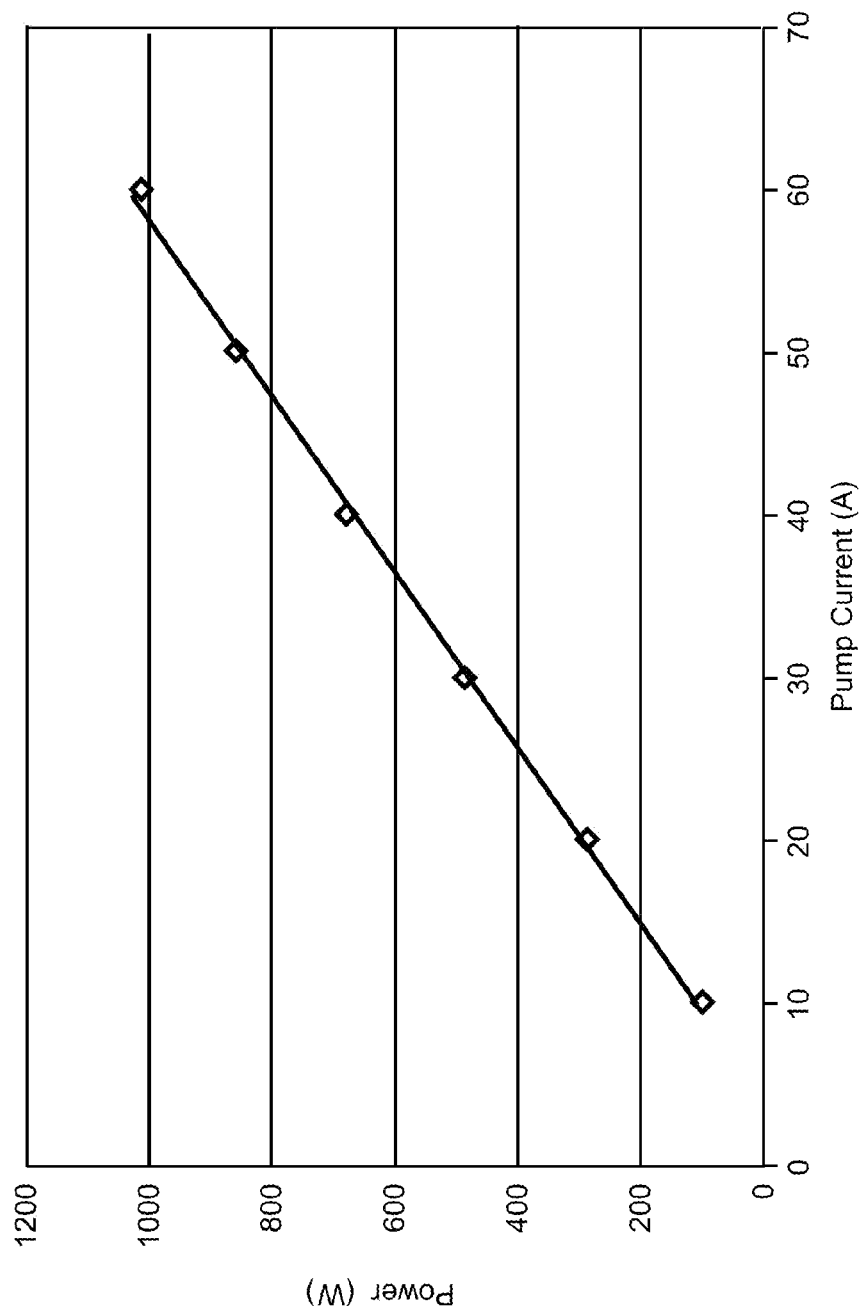
FIG. 11 is a graph schematically illustrating measured output power as a function of diode-laser pump current in an example of the laser of FIG. 3 using the Raman-transmitting mirror of FIG. 10.

FIG. 11 is a graph schematically illustrating measured output-power as a function of pump-current, i.e., current delivered to the diode-laser bar stacks, for the example of the inventive laser with the original mirror replaced by the new, Raman-transmitting, mirror. Power was measured at six different current-settings with the power measurements being a close fit to a linear plot. It was possible to increase power up to a target maximum power of 1.0 kW without the onset of pulsing.

Figure 12:
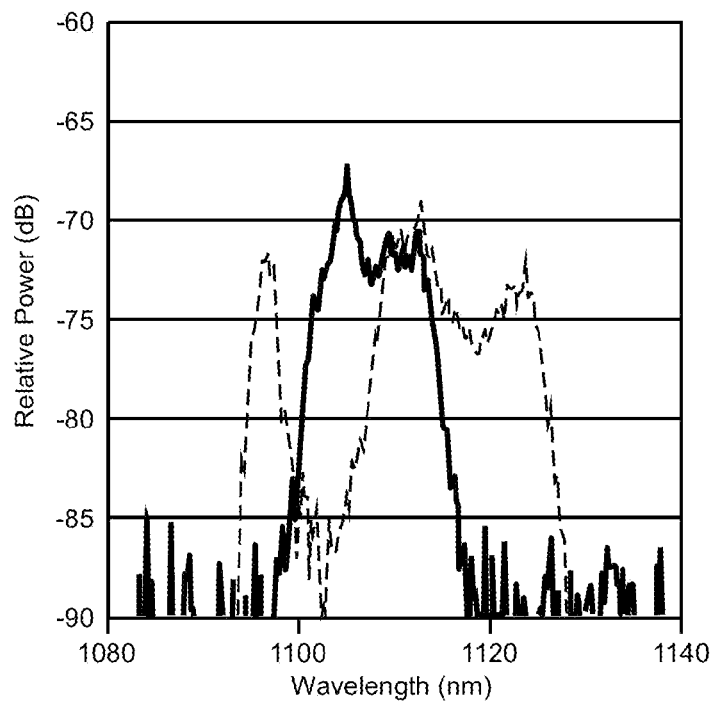
FIG. 12 is a graph schematically illustrating measured power output as a function of wavelength for an example of the laser of FIG. 3 using the mirrors of FIG. 10.

FIG. 12 is a graph schematically illustrating measured output power (log scale) as a function of wavelength for the example of the inventive laser with the original mirror (fine dashed curve) and the new Raman-transmitting mirror (bold solid curve). The bandwidth narrowing due to the Raman-gain suppression is clearly evident. Peak-emission with the Raman-transmitting mirror is at a wavelength about 10 nm shorter than with the original broad-band mirror.

Figure 10:
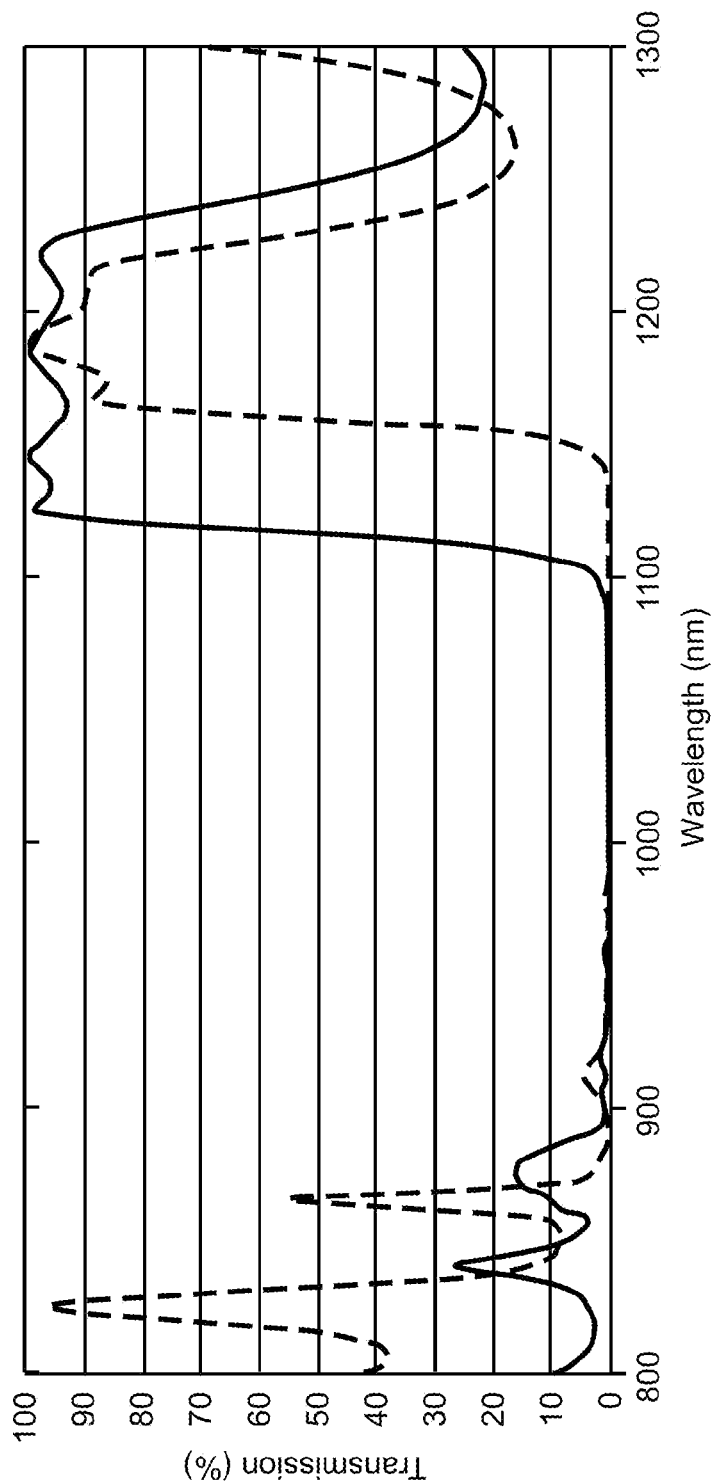
FIG. 10 is a graph schematically illustrating measured transmission spectra of two different highly reflective mirrors used in an experimental example of a laser in accordance with the embodiment of the present invention schematically depicted in FIG. 3 with one of the mirrors being reflective in the Raman-gain region and which produced the result of FIG. 9, and the other being highly transmissive in the Raman-gain region.
Figure 13:
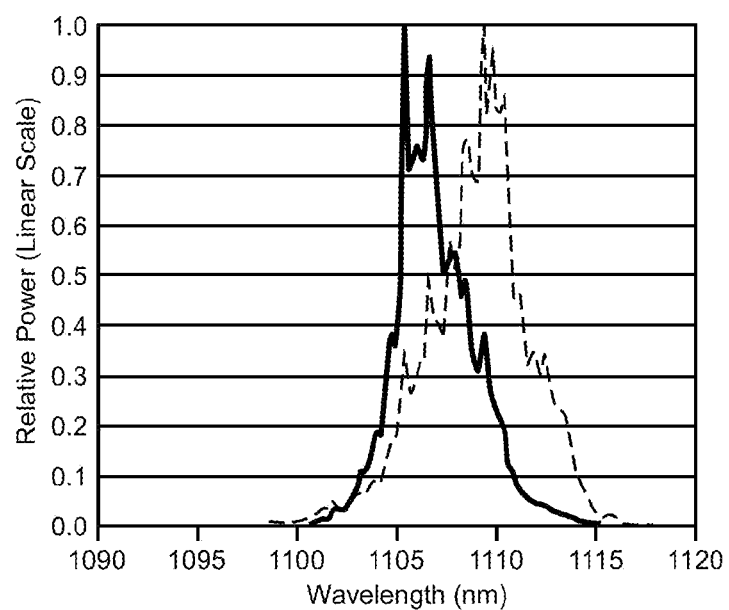
FIG. 13 is a graph schematically illustrating measured power output as a function of wavelength for an example of the laser of FIG. 3 using the Raman-transmitting mirror of FIG. 10 for two different proximity-coupling distances of the mirror from the end of the gain-fiber.

FIG. 13 is a graph schematically illustrating measured power-output as a function of wavelength for an example of the laser of FIG. 3 using the Raman-transmitting mirror of FIG. 10 for two different spacing distances S of the mirror from the end of the gain-fiber (see FIG. 3A). The bold solid curve depicts a case where the spacing S is near a maximum of about 100 μm. The fine dashed curve depicts a case where the spacing is essentially in contact with the end of the gain-fiber. It can be seen that increasing the spacing (in this case at least) from a closest spacing to a maximum practical spacing provides narrowing of the spectral bandwidth of the laser output with shifting of the lasing wavelength to shorter wavelengths.

Its believed that varying this spacing can be used to supplement Raman transmission by the mirror in increasing the threshold for the onset of unwanted pulsed output. It is possible that mirrors having a shorter long-wavelength transmission edge than Raman-transmitting mirror discussed above may provide quieter CW laser operation with a higher-power threshold for pulsing, and that this can be "fine tuned" by varying the spacing of the mirror from the end of the gain fiber. This can be determined by relatively simple experiments.

Figure 14:
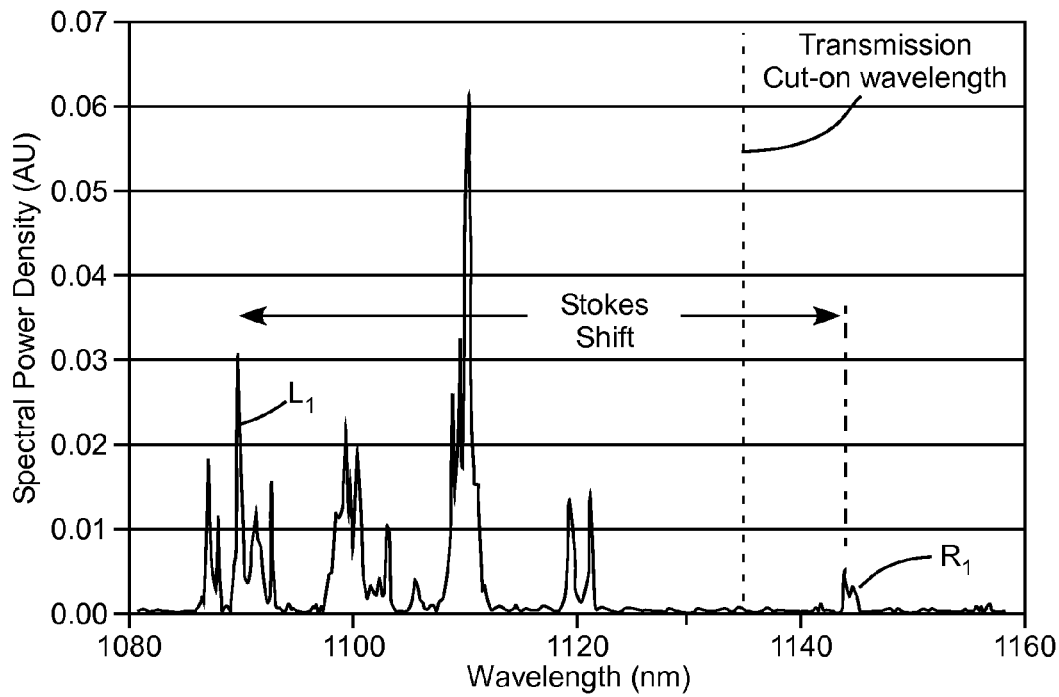
FIG. 14 is a graph schematically illustrating a lasing spectrum at pulsing threshold in a fiber laser similar to the inventive fiber laser but terminated by a mirror having a transmission cut on almost a Stokes shift away from a natural lasing wavelength.

FIG. 14 is a graph schematically illustrating a lasing (oscillation) spectrum at pulsing threshold in a fiber laser similar to the inventive fiber laser but terminated by a mirror having a transmission cut-on wavelength almost a Stokes shift away from a natural lasing wavelength. Lasing begins at a natural lasing wavelength of about 1090 nm as indicated by spectral peak $L_1$. As laser power builds up in the laser resonator, the lasing spectrum broadens into a region at wavelengths longer than about 1100 nm where the Raman gain makes a significant contribution to overall gain. This occurs because the cut-on wavelength of the terminating mirror is at about 1135 nm almost a Stokes shift from peak $L_1$. The Stokes shift from the wavelength of peak $L_1$ is evidenced by the small spectral peak $R_1$ at a wavelength of about 1145 nm. In order to minimize collateral generation of stimulated Raman scattering it is preferred that the transmission cut on of the highly reflective mirror in a laser in accordance with the present invention is within between about 20% and 80% of a Stokes shift of the lowest-wavelength peak in the oscillation spectrum with less than 50% being more preferred.

Figure 15:
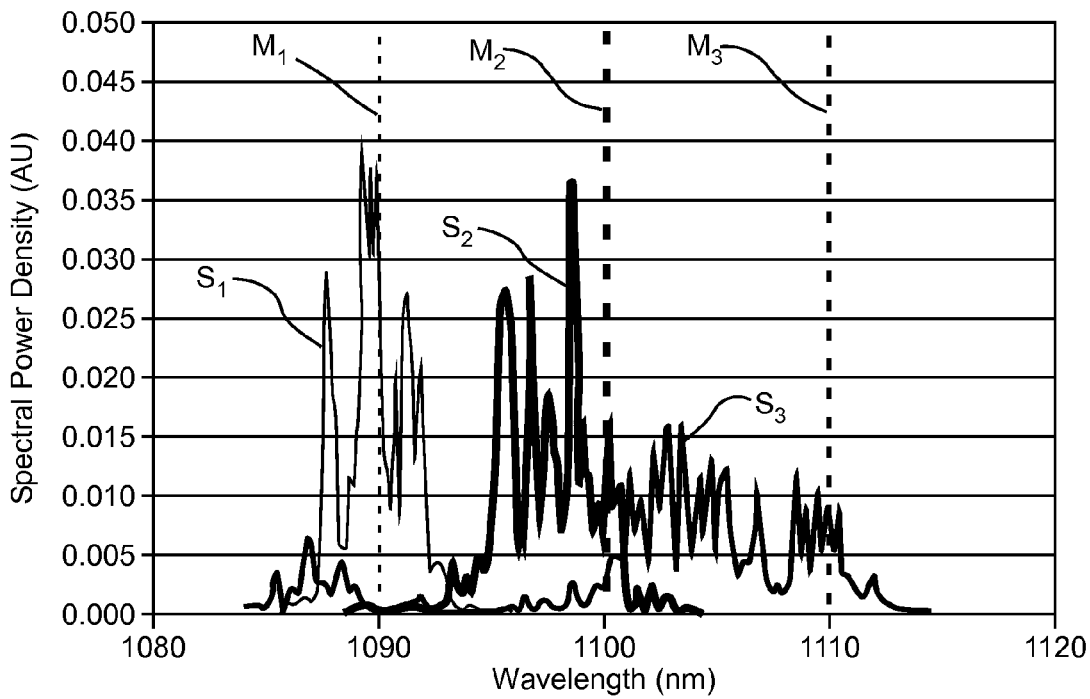
FIG. 15 is a graph schematically illustrating sub-pulsing threshold spectra in the inventive fiber laser for three different terminating mirrors each having a transmission cut-on wavelength significantly less than a Stokes shift from a natural lasing wavelength.

FIG. 15 is a graph schematically illustrating sub-pulsing threshold spectra in the inventive fiber laser for three different terminating mirrors each having a transmission cut-on wavelength significantly less than a Stokes shift from a natural lasing wavelength. The cut-on wavelengths are indicated by dashed lines $M_1$, $M_2$, and $M_3$, with corresponding lasing spectra $S_1$, $S_2$, and $S_3$. It can be seen that the lasing spectrum is broader the longer the cut-on wavelength of the mirror. The cut-on wavelength of mirror M2 here is about optimum, with most of the lasing spectrum being at wavelengths shorter than the cut-on wavelength where mirror reflectivity is high. If the mirror cut-on wavelength is moved to too short a wavelength such as in the case of mirror $M_1$, the pulsing threshold is raised but about half of the lasing spectrum is at wavelengths longer than the cut-on wavelength and leaks out of the resonator through the mirror.

Recapitulating here, the CW fiber-laser of the present invention uses a design approach different from that currently favored by the fiber-laser community. The design approach is motivated by factors including improved thermal management in the gain-fiber, single step aggregation of diode-laser bars to provide pump-radiation, stable multi-mode operation, high conversion efficiency and power scalability. The fiber-laser includes only a gain-fiber end-pumped via a water cooled active-fiber connector, with a conditioned beam from one or more fast-axis diode-laser bar stacks. The fiber-laser cavity simply consists of multilayer highly reflective (HR) multilayer dielectric mirror proximity coupled to one end of the active fiber and a 4% reflection from the uncoated opposite end of the fiber.

The HR mirror is highly reflective at the natural wavelength of operation (in the presence of broadband reflectors) and for the pump-radiation wavelength (to provide double-pass pump absorption). Crucially, the mirror is also highly transmitting at wavelengths longer than the natural wavelength of operation. This suppresses excessive bandwidth growth and associated temporal instabilities related to stimulated Raman scattering.

The laser architecture is notably splice free, thereby minimizing transverse mode coupling, maximizing efficiency and reducing the number of points of potential package-related failure. In contrast to prior-art fiber-lasers fabricated with traditional large-mode-area (LMA) fibers, the fiber is not coiled tightly to induce higher order mode leakage for providing differential modal gain. Indeed the inventive fiber-laser design is arranged to minimize differential modal gain, which minimization is a key to obtaining stable multimode operation at all power levels. Examples of the inventive laser have provided a stable multi-mode beam of radiation having a power greater than 1 kW with an $M^2$ of 2.72 (directly from the gain-fiber) with a beam parameter product (BPP) in the far field of about 2.5 millimeter.milliradians (mm.mRad).

The fiber-laser of the present invention is described above in terms of the basic layout of FIG. 3 showing functional elements and the interaction of those elements, and in terms of a preferred embodiment of the fiber-laser depicted in FIG. 5 with detailed drawings and descriptions of the functional elements. The present invention is not limited, however, to the preferred embodiment described and depicted. Rather the invention is limited only by the claims appended hereto.

What is claimed is:

1. A laser apparatus, comprising: a gain fiber having first and second opposite ends and having a fundamental emission wavelength for laser radiation, the gain-fiber providing optical gain over a characteristic gain-bandwidth; a laser resonator defined by the first end of the gain-fiber and a mirror proximity-coupled to the second end of the gain-fiber; a source of optical pump-radiation having a pump-radiation wavelength; the mirror being highly reflective for wavelengths within the gain-bandwidth of the fiber, highly reflective for the pump-radiation wavelength, and highly transmissive for radiation having wavelengths longer than the gain-bandwidth; an optical arrangement configured to focus at least a substantial portion of the pump-radiation into the first end of the gain-fiber thereby causing laser-radiation at a natural wavelength within the gain-bandwidth to be generated in the laser-resonator, and delivered from the first end of the gain-fiber as output radiation; and wherein the gain-fiber is configured and arranged such that the generated and delivered radiation is multiple-lateral-mode radiation and has a radiation spectrum comprising a plurality of oscillation peaks at different wavelengths, and the mirror has a long-wavelength transmission cut-on wavelength, and wherein the transmission cut-on wavelength is between about 20% and 80% of a Stokes shift of the shortest wavelength of one of the oscillation peaks.

2. The apparatus of claim 1, wherein the gain-fiber has a ytterbium-doped core.

3. The apparatus of claim 1, wherein the gain-fiber includes a doped-core surrounded by a first cladding having a refractive index less than that that of the doped core, a second cladding surrounding the first cladding and having a refractive index less than that of the first cladding.

4. The apparatus of claim 3, wherein the pump-radiation focusing arrangement is such that one portion of the pump radiation is not focused into the first end of the gain fiber and another portion is focused into the first and second claddings.

5. The apparatus of claim 4, wherein a length of the gain-fiber immediately adjacent the first end thereof is surrounded by a coupling unit, the coupling unit being configured to absorb any pump-radiation not coupled into the end of the fiber, strip out pump-radiation propagating in the second cladding of the fiber, and provide cooling in the region of the gain-fiber surrounded thereby.

6. The laser of claim 5 wherein the gain-fiber further includes a protective polymer coating a part of which is surrounded by the coupling unit and the coupling unit is arranged to cool that part of the polymer coating surrounded thereby.

7. The laser of claim 6, wherein the coupling unit is arranged to provide the cooling of the gain-fiber surrounded thereby by flowing cooling-fluid and flowing gas.

8. The apparatus of claim 1, wherein the proximity coupled mirror is at a finite distance from the second end of the gain-fiber and the finite distance is adjustable.

9. The apparatus of claim 1 wherein the first end of the gain-fiber is uncoated.

10. The apparatus of claim 1 wherein the pump-radiation source includes at least one fast-axis diode-laser bar stack.

11. The apparatus of claim 10, wherein the pump-radiation source has an output power greater than about 1 kilowatt.

12. The apparatus of claim 11, wherein the pump-radiation source includes a plurality of fast-axis diode-laser bar stacks.

13. The apparatus of claim 12, wherein the pump-radiation source includes first and second fast-axis diode-laser bar stacks oriented at 90° to each other with the output of the stacks combined via a polarization-sensitive beam-combiner.

14. The apparatus of claim 1, wherein the gain-fiber is a single length of fiber without any splices to other fibers.

15. The apparatus of claim 1, wherein the generated and delivered laser-radiation is continuous wave radiation.

16. The apparatus of claim 1, wherein the transmission cut-on wavelength is less than 50% of a Stokes shift of the shortest wavelength of one of the oscillation peaks.

17. A laser apparatus, comprising: a gain fiber having first and second opposite ends and having a fundamental emission wavelength for laser radiation, the gain-fiber providing optical gain over a characteristic gain-bandwidth; a laser resonator defined by the first end of the gain-fiber and a mirror proximity-coupled to the second end of the gain-fiber; a source of optical pump-radiation having a pump-radiation wavelength; the mirror being highly reflective for wavelengths within the gain-bandwidth of the fiber; an optical arrangement configured to focus at least a substantial portion of the pump-radiation into the first end of the gain-fiber thereby causing laser-radiation at a natural wavelength within the gain-bandwidth to be generated in the laser-resonator, and a coupling unit, wherein a length of the gain-fiber immediately adjacent the first end thereof is surrounded by said coupling unit, the coupling unit containing a central channel having a diameter at least three times the diameter of the fiber, said central channel having an open distal end, with the end of the fiber being free-standing in the channel, with the region between the outer surface of the fiber and the inner surface of the central channel being open, wherein the entire diameter of the distal end of the channel is unobstructed so that any pump-radiation not coupled into the end of the fiber can reach and be absorbed in the walls of the channel.

18. The apparatus of claim 17, wherein the gain-fiber is a single length of fiber without any splices to other fibers.

19. The apparatus of claim 17, wherein the gain-fiber is provided with cooling means along the entire length thereof between the coupling unit and the second end of the gain-fiber.

20. The apparatus of claim 17, wherein the fiber has one or more polymer coatings, and wherein the coatings are stripped off in the region of fiber that is located inside the channel.

21. The apparatus of claim 17, wherein the coupling unit is made of metal material.

22. The apparatus of claim 17, wherein the inner surface of the channel is textured.

23. The apparatus of claim 17, wherein the coupling unit includes an inlet aperture in communication with the channel for carrying away heat by flowing air through the channel via the inlet aperture.

24. The apparatus of claim 17 wherein the laser radiation generated in the gain fiber is coupled out of the gain fiber from the first end thereof.

* * * * *